United States Patent
Wojcik et al.

(10) Patent No.: US 11,355,896 B2
(45) Date of Patent: Jun. 7, 2022

(54) OPTOELECTRONIC COMPONENT COMPRISING A LASER DIODE

(71) Applicant: OSRAM Opto Semiconductors GmbH, Regensburg (DE)

(72) Inventors: Andreas Wojcik, Regensburg (DE); Markus Pindl, Tegernheim (DE)

(73) Assignee: OSRAM OLED GMBH, Regensburg (DE)

( * ) Notice: Subject to any disclaimer, the term of this patent is extended or adjusted under 35 U.S.C. 154(b) by 158 days.

(21) Appl. No.: 16/488,573

(22) PCT Filed: Feb. 27, 2018

(86) PCT No.: PCT/EP2018/054821
§ 371 (c)(1),
(2) Date: Aug. 23, 2019

(87) PCT Pub. No.: WO2018/158257
PCT Pub. Date: Sep. 7, 2018

(65) Prior Publication Data
US 2020/0119526 A1  Apr. 16, 2020

(30) Foreign Application Priority Data
Feb. 28, 2017 (DE) .......................... 102017104108.7

(51) Int. Cl.
*H01S 5/00* (2006.01)
*H01S 5/20* (2006.01)
(Continued)

(52) U.S. Cl.
CPC .......... *H01S 5/005* (2013.01); *G02B 6/12004* (2013.01); *H01S 5/2027* (2013.01); *H01S 5/4025* (2013.01)

(58) Field of Classification Search
CPC ...... H01S 5/4025; H01S 5/2027; H01S 5/026; H01S 5/005; G02B 6/12004
See application file for complete search history.

(56) References Cited

U.S. PATENT DOCUMENTS 5,262,184 A  11/1993 Rorvik et al.
5,265,184 A  11/1993 Lebby et al.
(Continued)

*Primary Examiner* — Xinning(Tom) Niu
(74) *Attorney, Agent, or Firm* — Slater Matsil, LLP

(57) ABSTRACT

An optoelectronic component comprising a laser diode is disclosed. In an embodiment an optoelectronic component includes a carrier, a laser diode arranged on the carrier, wherein the laser diode is configured to emit electromagnetic radiation in a lateral radiation and a radiation-guiding layer arrangement located in front of the lateral face of the laser diode, wherein the layer arrangement includes at least a first layer and a second layer, wherein the first layer is arranged on the carrier, wherein the second layer is arranged on the first layer, wherein the first layer and the second layer abut each other, wherein the second layer is transparent for the electromagnetic radiation, wherein the first layer has a smaller refractive index than the second layer, and wherein the layer arrangement is arranged such that the electromagnetic radiation of the laser diode is coupled into the second layer, guided in the second layer to a radiation surface of the second layer, and emitted via the radiation surface of the second layer.

20 Claims, 4 Drawing Sheets

(51) Int. Cl.
   *H01S 5/40*   (2006.01)
   *G02B 6/12*   (2006.01)

(56) References Cited

U.S. PATENT DOCUMENTS

| | | |
|---|---|---|
| 5,522,002 A | 5/1996 | Chun et al. |
| 6,556,610 B1 | 4/2003 | Jiang et al. |
| 6,842,472 B1 | 1/2005 | Shimonaka |
| 2003/0151121 A1* | 8/2003 | Kuhara .................. G02B 6/421 |
| | | 257/666 |
| 2004/0121520 A1* | 6/2004 | Karkkainen ........... G02B 6/423 |
| | | 438/107 |
| 2005/0058399 A1* | 3/2005 | Nishizawa ........... G02B 6/4214 |
| | | 385/39 |
| 2006/0093002 A1 | 5/2006 | Park et al. |
| 2012/0141063 A1 | 6/2012 | Yamamoto et al. |
| 2014/0003765 A1 | 1/2014 | Tseng et al. |
| 2016/0284944 A1* | 9/2016 | Narita .................. H01L 33/005 |

* cited by examiner

OPTOELECTRONIC COMPONENT COMPRISING A LASER DIODE

This patent application is a national phase filing under section 371 of PCT/EP2018/054821, filed Feb. 27, 2018, which claims the priority of German patent application 102017104108.7, filed Feb. 28, 2017, each of which is incorporated herein by reference in its entirety.

TECHNICAL FIELD

The present invention relates to an optoelectronic component having a laser diode and to a method for producing an optoelectronic component having a laser diode.

BACKGROUND

In the prior art, it is known to connect a laser diode to a waveguide in the form of an optical fiber in order to guide the light in the desired direction starting from the laser diode.

SUMMARY OF THE INVENTION

Embodiments provide an improved optoelectronic component having a laser diode and a radiation guiding. Further embodiments provide a simple method for producing an optoelectronic component having a laser diode and a radiation guiding.

An advantage of the disclosed component is that a simple and reliable guiding of radiation of the electromagnetic radiation of the laser diode may be achieved by simple means. For this purpose, a laser diode is provided on a carrier, wherein the laser diode comprises a radiation surface for the electromagnetic radiation on a side face. Hence, the laser diode is embodied to emit the electromagnetic radiation in a lateral direction of radiation. A radiation-guiding layer arrangement is provided in the direction of radiation in front of the laser diode. The layer arrangement is an optical waveguide. The layer arrangement comprises at least a first layer and a second layer. The first layer is arranged on the carrier. The second layer is arranged on the first layer. The second layer is formed from a material which is transparent for the electromagnetic radiation of the laser diode. The first layer comprises a smaller optical refractive index than the second layer. For example, the refractive indices of the first and second layer may differ by at least 1%, in particular by 5% or even by more than 5%. The layer arrangement of the first and second layer is embodied and arranged in such a way that the electromagnetic radiation of the laser diode is coupled into the second layer. The second and first layer are embodied in such a way that the electromagnetic radiation is in the second layer guided to a radiation surface of the second layer and leaves the second layer via the radiation surface. In addition, the second layer is formed from a forming material.

Forming materials may be ductile materials produced from a liquid or pasty material. For example, the second layer may consist of silicone, epoxy resin, plastics or another transparent and liquid or pasty material, In particular, the second layer may consist of a molding material. Forming the second layer from a molding material allows for simple deposition of the second layer on the first layer. For example, the second layer may be sprayed onto the first layer. In addition, depending on the chosen embodiment, the second layer may be formed by means of a molding process with regard to its structure. In particular, the radiation surface of the second layer may be produced in a simple manner and having a desired alignment, a desired size and/or a desired roughness by means of a molding process.

In a further embodiment, the first layer comprises a radiation surface abutting on an irradiation surface of the second layer. The electromagnetic radiation leaves the first layer via the radiation surface and passes over into the second layer. The first layer may in this embodiment be formed from a forming material, wherein the radiation surface of the first layer is produced by means of a molding process. In this manner, the alignment, the size and/or the roughness of the radiation surface of the first layer may be produced in a precise manner.

In another embodiment, the first layer directly abuts on the radiation surface of the laser diode with an irradiation surface. The first and the second layer are embodied in such a way that the electromagnetic radiation from the laser diode is coupled into the second layer via the first layer. For this purpose, the first layer comprises a radiation surface that abuts on an irradiation surface of the second layer.

Depending on the chosen embodiment, the irradiation surface of the first layer may be arranged at a distance from the laser diode. A further material may be provided between the laser diode and the irradiation surface of the first layer. In addition, a free space may be provided between the radiation surface of the laser diode and the irradiation surface of the first layer.

In another embodiment, the second layer abuts on the radiation surface of the laser diode with an irradiation surface. In addition, depending on the chosen embodiment, the irradiation layer of the second layer may be arranged at a distance from the radiation surface of the laser diode. In this context, a free space may be provided between the radiation surface of the laser diode and the irradiation surface of the second layer.

If the irradiation surface of the first layer directly abuts on the radiation surface of the laser diode, the electronic radiation may be efficiently coupled into the first layer.

If the second layer abuts on the radiation surface of the laser diode with the irradiation surface, an improved coupling of the electromagnetic radiation directly into the second layer may be achieved, as well.

In another embodiment, the radiation surface of the second layer has a larger distance to the carrier than the radiation surface of the laser diode. This is achieved by embodying the first and second layer in such a way that a boundary surface between the first and second layer comprises an increasing distance to the carrier in the direction of the position of the radiation surface of the second layer. Thereby, a radiation guiding of the electromagnetic radiation away from the carrier is achieved by simple means. In this manner, e.g., shadowing effects of the carrier for the electromagnetic radiation of the laser diode may be reduced or avoided.

In a further embodiment, the radiation surface of the first layer and the radiation surface of the second layer are produced by means of compression molding. Compression molding is particularly suitable for forming precise surfaces with regard to the shape as well as with regard to the surface quality, in particular with regard to roughness.

Depending on the chosen embodiment, the first layer and/or the second layer may extend over an upper side of the laser diode. For example, the entire laser diode may be covered by the layer arrangement of the first and second layer. In this manner, the formation of the optical waveguide as well as a protection of the laser diode may be achieved by forming the layer arrangement. Depending on the chosen embodiment, only the first layer or only the second layer may cover the laser diode.

In a further embodiment, the layer arrangement comprises a third layer which is arranged on the second layer. The third layer has a smaller optical refractive index than the second layer. Thereby, a total reflection of the electromagnetic radiation at the boundary surface may be achieved between the second layer and the third layer. Moreover, by forming the third layer the second layer is protected against environmental influences. The refractive index of the second layer may, e.g., be higher by about 1% or by about 5% or more than the refractive index of the third layer. Depending on the chosen embodiment, the third layer may cover the radiation surface of the second layer and comprise a radiation surface, as well. Depending on the chosen embodiment, the radiation surface of the third layer may be produced by means of a forming process. In this embodiment, the third layer is also formed from a forming material, in particular from a molding material.

Depending on the chosen embodiment, the first layer or the third layer may comprise a trench, wherein the second layer is arranged within the trench. In this manner, the radiation guiding may be further improved as due to the width and the shape of the trench it is possible to more precisely guide the radiation. Due to the shape of the trench, the electromagnetic radiation may be guided not only vertically with regard to the carrier, but also horizontally with regard to the carrier. Furthermore, due to the shape of the trench, coupling into the second layer as well as coupling out of the second layer may be carried out by means of defined surfaces. Forming the trench and filling the trench with the second layer thus allows for flexible radiation guiding.

In another embodiment, the second layer is formed as a bridge on the first layer and covered by the third layer. Due to this embodiment, a good radiation guiding may be achieved by simple means.

BRIEF DESCRIPTION OF THE DRAWINGS

The above-described properties, features and advantages of the present invention as well as the manner in which they are achieved will become clearer and easier to understand in context with the following description of the embodiment examples that are explained in conjunction with the drawings, in which.

DETAILED DESCRIPTION OF ILLUSTRATIVE EMBODIMENTS

Figure 1:
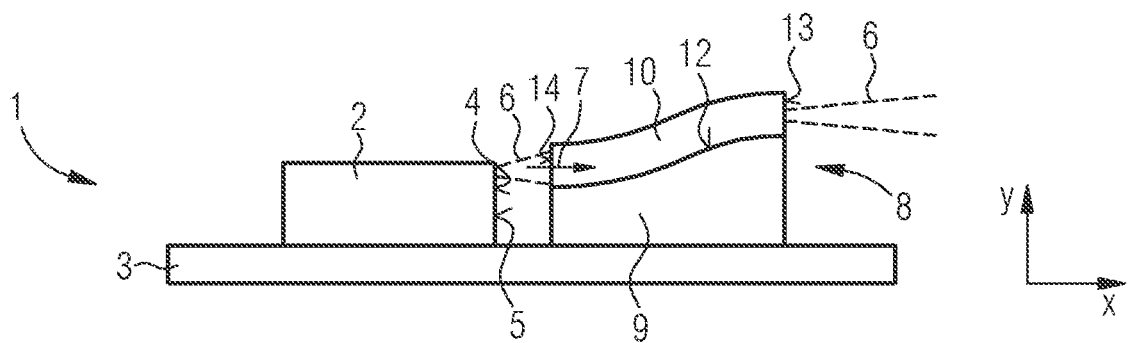
FIG. 1 shows a schematic cross-section through a first embodiment of a component with a layer arrangement arranged at a distance from the laser diode.

FIG. 1 shows a schematic cross-section through an optoelectronic component 1 comprising a laser diode 2, wherein the laser diode 2 is arranged on a carrier 3 with a bottom side. The laser diode 2 is embodied to emit an electromagnetic radiation 6 in a lateral radiation direction 7 via a radiation surface 4 of a lateral face 5. The direction of radiation 7 is in the shown example parallel to the upper side of the carrier 3 and perpendicular to the side face 5 of the laser diode 2 alongside an x axis. The carrier may, e.g., be embodied as a substrate, a plate, e.g., made of metal, or as a printed circuit board.

In the direction of radiation 7, a layer arrangement 8 having a first and a second layer 9, 10 is provided laterally to the laser diode. The first layer 9 is arranged on the carrier 3. On the first layer 9, the second layer 10 is arranged. The first and second layer 9, 10 abut on each other via a boundary surface 12. In the depicted embodiment, the boundary surface 12 is arranged perpendicular to the x-y plane of the shown cross-section. In the shown embodiment, the boundary surface 12 is arranged in the area of the irradiation surface 14 of the second layer 10 below the radiation surface 4 of the laser diode 2. In this manner, the electromagnetic radiation 6 from the laser diode 2 may be directly irradiated into the irradiation surface 14 of the second layer 10. In the shown embodiment, the first layer 9 is arranged directly on the carrier 3. Depending on the depicted embodiment, at least one further layer may be provided between the first layer 9 and the carrier 3. The second layer 10 is transparent for the electromagnetic radiation of the laser diode 2. The first layer 9 has a smaller optical refractive index than the second layer 10. For example, the refractive indices may differ by at least 1%, in particular by 5% or more. A typical value for the refractive index of the first layer may be 1.41. Furthermore, a typical value for the refractive index of the second layer 10 may be in the range of 1.54. In the shown embodiment, no further layer is arranged above the second layer 10. Thus, the electromagnetic radiation 6 is guided in the direction of a radiation surface 13 of the second layer 10 within the second layer 10 by means of a total reflection at the boundary surfaces of the second layer 10 after irradiation via the irradiation surface 14 of the second layer 10.

In the depicted embodiment, a distance of the boundary surface 12 increases from the upper side of the carrier 3 in a y axis originating from the irradiation surface 14 of the second layer in the direction of the radiation surface 13, i.e., along the x axis with increasing distance from the irradiation surface 14. Thus, the radiation surface 13 is arranged at a larger distance with regard to the carrier 3 than the irradiation surface 14 of the second layer 10. Depending on the chosen embodiment, the boundary surface 12 may have a constant distance to the carrier 3 in the y axis between the irradiation surface 14 and the radiation surface 13. In addition, the distance to the carrier 3 starting from the irradiation surface 14 of the second layer 10 may decrease in the direction of the radiation surface 13 of the second layer 10.

In the depicted embodiment, the first and the second layer 9, 10 have the same length along the x axis. In addition, the first and the second layer 9, 10 are arranged in the same section along the x axis. The second layer 10 is made from a forming material, particularly a molding material. A forming material is a material that may be deposited in liquid or in pasty or soft form. Moreover, the forming material may be embodied as a molding material in order to be brought into a desired shape by means of molding techniques. For example, silicon or epoxy material or plastic material is used as a molding material. The molding material has the advantage that the irradiation surface 14 of the second layer 10 and/or the radiation surface 13 of the second layer 10 may be produced by means of a molding process. Thereby, the orientation, the size and the surface roughness of the irradiation surface 14 of the second layer 10 may be produced in a precise manner. Moreover, in this way the orientation, the size and the surface roughness of the radiation surface 13 of the second layer 10 may be produced in a precise manner. In particular, a precise alignment of the irradiation surface 14 of the second layer 10 as well as a precise orientation of the radiation surface 13 of the second layer 10 may be achieved with regard to the laser diode 2, in particular with regard to the radiation surface 4 of the laser diode 2. As explained above, the radiation surface 13 of the second layer 10 is in the depicted embodiment arranged along the y axis, which is aligned perpendicularly to the plane of the carrier 3 and perpendicularly to the x axis, in a higher position than the irradiation surface 14 of the second layer 10.

Figure 2:
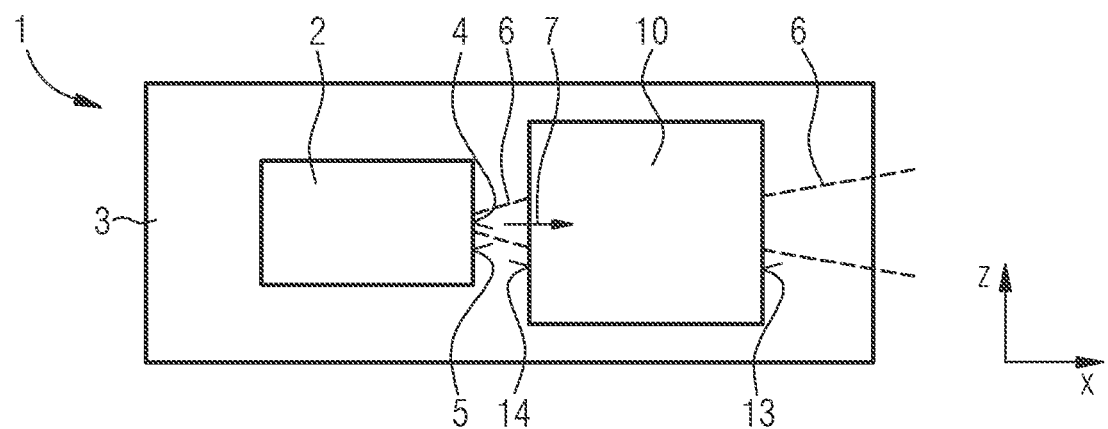
FIG. 2 depicts a schematic top view onto the arrangement of FIG. 1.

FIG. 2 shows a schematic top view onto the arrangement of FIG. 1. The first and the second layer 9, 10 have the same size and the same position with regard to the z axis and the x axis. The z-y-x axes form an orthogonal coordinate system. As well as the second layer 1o, the first layer 9 may consist of a forming material, in particular a molding material, and may particularly be produced by means of a molding process. In addition, the first layer 9 may be formed from a material that is transparent for the electromagnetic radiation of the laser diode 2.

Figure 3:
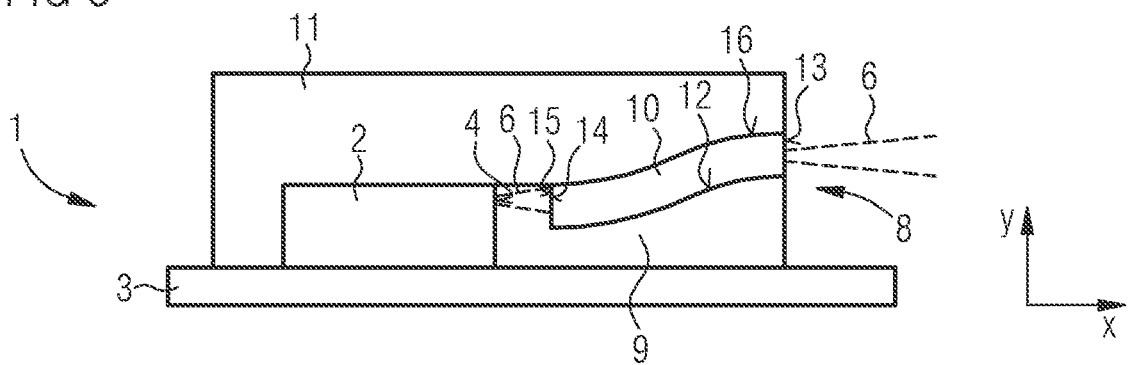
FIG. 3 depicts a schematic cross-section through a second embodiment of a component in which the first layer abuts on the laser diode.

FIG. 3 shows a schematic cross-section through a further embodiment of a component 1 that is essentially embodied according to the component of FIG. 1. In the present embodiment, contrary to that of FIG. 1, the first layer 9 extends up to the lateral face 5 of the laser diode 2 and up to the radiation surface 4 over which the electromagnetic radiation 6 of the laser diode 2 is emitted. Thus, the first layer 9 is arranged between the irradiation surface 14 of the second layer 10 and the radiation surface 4 of the laser diode 2. Thus, the first layer 9 is arranged between the irradiation surface 14 of the second layer 10 and the radiation surface 4 of the laser diode 2. Thus, the first layer 9 comprises a radiation surface 15 that abuts on the irradiation surface 14 of the second layer 10. In the shown example, the radiation surface 15 of the first layer 9 is essentially arranged in parallel to the side face 5 of the laser diode 2. Analogously, the irradiation surface 14 of the second layer 10, as well, is essentially arranged in parallel to the side face 5 of the laser diode 2. Depending on the chosen embodiment, the radiation surface 15 of the first layer 9 and the irradiation surface 14 of the second layer 10 may be arranged at an angle that is inclined with regard to the side face 5 of the laser diode.

In addition, in the shown embodiment, a third layer 11 is deposited on the second layer 10, also covering the laser diode 2. Thus, a second boundary surface 16 is embodied between the third layer 11 and the second layer 10. The third layer 11 has an optical refractive index that is smaller than the optical refractive index of the second layer 10. Depending on the chosen embodiment, the optical refractive index of the second layer 10 may be higher by at least 1%, in particular by 5% or more than the optical refractive index of the third layer 11. Due to the difference of the refractive indices, a total reflection of the electromagnetic radiation 6 is achieved at the second boundary surface 16, which is guided into the second layer. As a result, in this embodiment, too, the electromagnetic radiation 6 in the second layer 10 is guided to the radiation surface 13 of the second layer 10.

The irradiation surface 14 of the second layer 10 is essentially arranged perpendicular to the direction of radiation 7 of the electromagnetic radiation. This allows for coupling in the electromagnetic radiation into the second layer 10 in a low-reflection manner. The third layer 11 protects the second layer 10 and the laser diode 2 against environmental influences. Depending on the chosen embodiment, the radiation surface 15 of the first layer 9 may also be produced by means of a molding method. In addition, the third layer 11 may also consist of a molding material, in particular silicon, plastic or epoxy resin. In this embodiment, as well, the distance of the boundary surface 12 increases along the y axis starting from the irradiation surface 14 of the second layer 10 in the direction of the radiation surface 13 of the second layer 10 towards the carrier 3. Depending on the chosen embodiment, the boundary surface 12 may also have a constant distance between the irradiation surface 14 and the radiation surface 13 in the y axis towards the carrier 3. In addition, the distance to the carrier 3 may decrease starting from the irradiation surface 14 of the second layer 10 in direction of the radiation surface 13 of the second layer 10.

Figure 4:
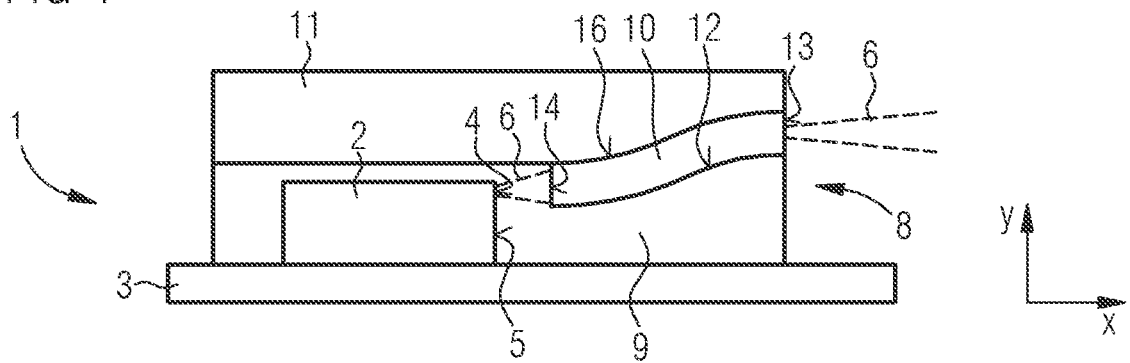
FIG. 4 shows a schematic cross-section through a further form of a component in which the layer arrangement covers the laser diode.

FIG. 4 shows a further embodiment of a component 1 essentially embodied according to the embodiment of FIG. 3, whereas, however, in the present embodiment the laser diode 2 is embedded in the first layer 9. In this embodiment, too, the irradiation surface 14 of the second layer 10 is arranged at a distance from the radiation surface 4 of the laser diode 2. An upper side of the second layer 10 and an upper side of the first layer 9 are covered by the third layer 11. In this embodiment, too, a radiation surface 15 of the first layer 9 abuts on an irradiation surface 14 of the second layer 10. The radiation surface 15 of the first layer 9 may be produced by means of a molding process. In this embodiment, as well, a height of the boundary surface 12 between the first and second layer 9, 10 increases in the direction of the radiation surface 13 of the second layer 10 with regard to the carrier 3. Depending on the chosen embodiment, the boundary surface 12 may have a constant distance to the carrier 3 in the y axis between the irradiation surface 14 and the radiation surface 13. Moreover, the distance to the carrier 3 may decrease starting from the irradiation surface 14 of the second layer 10 in direction of the radiation surface 13 of the second layer 10.

Figure 5:
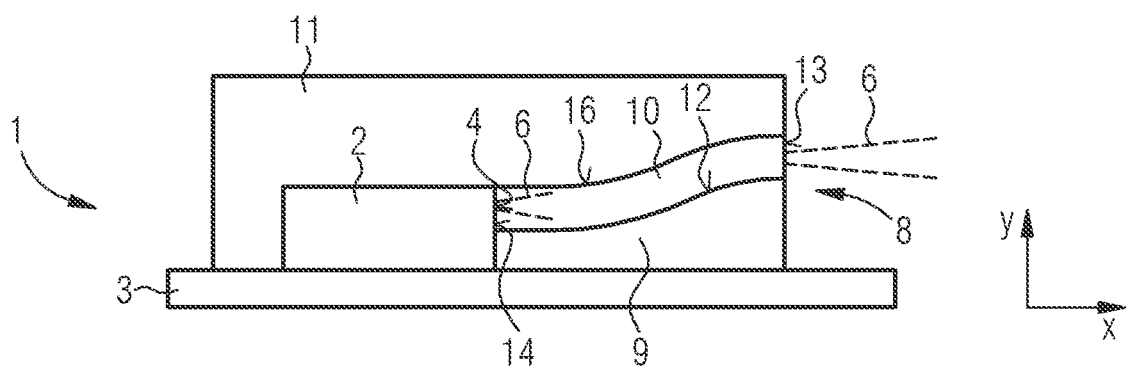
FIG. 5 depicts a further schematic view of a cross-section through an embodiment of a component in which the second layer abuts on the laser diode.

FIG. 5 shows a further embodiment of a component 1 that is essentially embodied according to the embodiment of FIG. 3, wherein the first layer 9 abuts on the side face 5 of the laser diode 2 below the radiation surface 4. The second layer 10 is arranged on the first layer 9 and guided up to the radiation surface 4 of the laser diode 2. Thus, in this embodiment, the irradiation surface 14 of the second layer 10 is embodied adjacent to the radiation surface 4 of the laser diode 2. On the second layer 10, a third layer 11 is deposited that also covers the laser diode 2. In this embodiment, too, a height of the boundary surface 12 between the first and second layer 9, 10 increases in direction of the radiation surface 13 of the second layer 10 with regard to the carrier 3. Depending on the chosen embodiment, the boundary surface 12 may have a constant distance to the carrier 3 in the y axis between the irradiation surface 14 and the radiation surface 13. Further, the distance to the carrier 3 may decrease starting from the irradiation surface 14 of the second layer 10 in the direction of the radiation surface 13 of the second layer 10.

Figure 6:
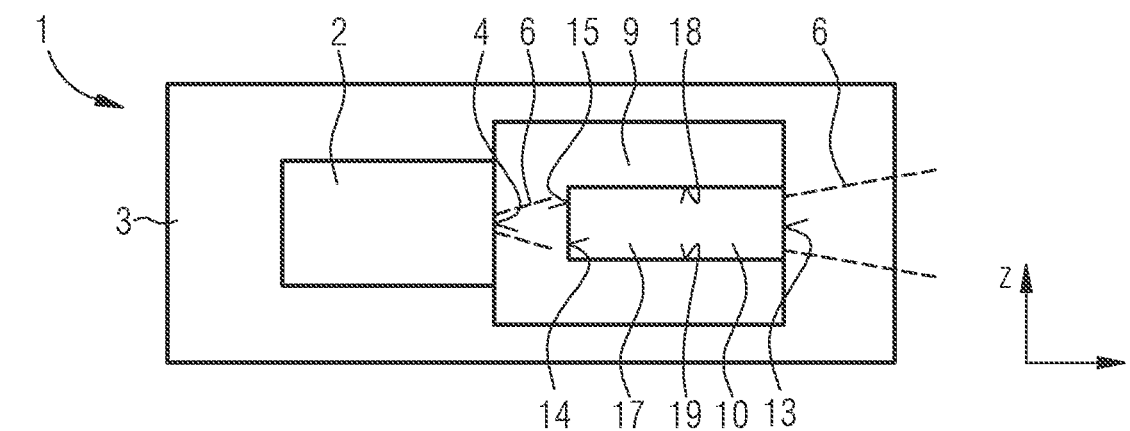
FIG. 6 shows a schematic cross-section through a further embodiment of a component in which the first layer comprises a trench in which the second layer is arranged.

FIG. 6 shows a schematic top view of a further embodiment of a component 1 in a z-x plane wherein the first layer 9 comprises a trench 17, wherein the second layer 10 is arranged within the trench 17. In the depicted embodiment, the trench 17 is arranged at a distance to the radiation surface 4 of the laser diode 2 and extends in a direction of radiation along the x axis with a constant width in the z axis up to a radiation surface 13 of the second layer 10. Depending on the chosen embodiment, the width of the trench 17 may vary along the x direction. For example, the width of the trench 17 in the x direction may increase in the direction of the radiation surface 13 of the second layer 10. In addition, the width of the trench 17 may decrease in the x direction in the direction of the radiation surface 13 of the second layer 10.

Figure 7:
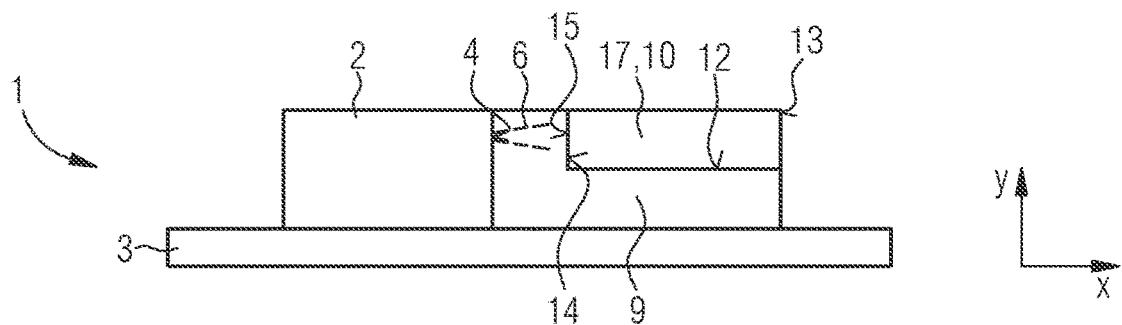
FIG. 7 shows a cross-section through the arrangement of FIG. 6.

FIG. 7 shows a cross-section that is perpendicular to the z axis in the y-x plane through the arrangement of FIG. 6. The trench 17 may, e.g., be introduced into the first layer 9 by means of photolithographic processes. Moreover, the trench 17 may be introduced into the first layer by means of a molding process. By forming the trench 17, an improved radiation guiding in the z direction may be achieved. The electromagnetic radiation 6 that is guided into the second layer 10 is totally reflected at sidewalls 18, 19 of the trench 17. The use of the trench 17, in addition to the boundary surface 12, allows for a more precise radiation guiding. Depending on the chosen embodiment, the trench 17 may have differing shapes. In the shown embodiment, the boundary surface 12 between the first layer 9 and the second layer 10 is arranged at the same height with regard to the y axis over the entire length of the trench 17 along the x axis. Depending on the chosen embodiment, the boundary surface 12 may have an increasingly higher position on the y axis, i.e., a larger distance to the carrier 3 in the direction of the radiation surface 13 of the second layer 10. In the same manner, the distance between the boundary surface 12 and the carrier 3 may decrease in the direction of the radiation surface 13 of the second layer 10. The trench 17 has a height along the y direction. The height of the trench 17 may vary in the x direction. For example, the height of the trench 17 along the x direction may increase in the direction of the radiation surface 13 of the second layer 10. Moreover, the height of the trench 17 may also decrease in the x direction in the direction of the radiation surface of the second layer 10.

Figure 8:
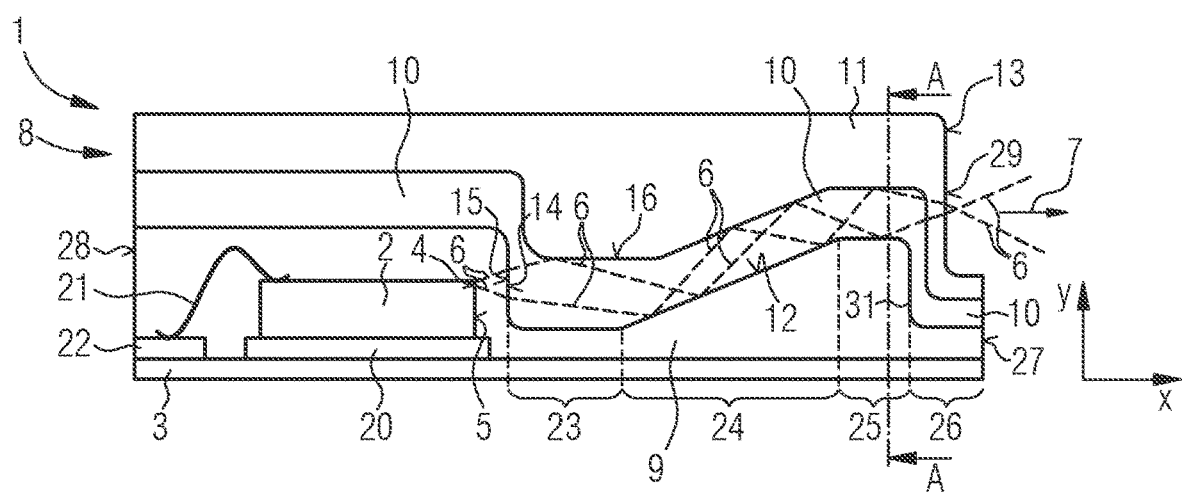
FIG. 8 depicts a schematic cross-section through a further embodiment of a component in which a third layer is arranged on the second layer.

FIG. 8 shows a schematic cross-section along a y-x plane through a further embodiment of a component 1. The laser diode 2 is connected to the carrier 3 via a metallization 20. In addition, a bond wire 21 is guided from the upper side of the laser diode 2 to a second metallization 22 that is also arranged onto the carrier 3. The laser diode 2 and the carrier 3 are covered by the first layer 9, wherein the first layer 9 comprises a radiation surface 15 in the direction of radiation 7 in front of the radiation surface 4 of the laser diode 2. The radiation surface 15 is essentially perpendicular to the radiation direction 7 of the electromagnetic radiation 6 of the laser diode 2.

Starting from the radiation surface 15, the first layer 9 has a constant layer thickness in a first section 23 in the x direction. After the first section 23, the layer thickness of the first layer 9 increases continuously in a second section 24 in the direction of the x axis up to a third section 25. In the third section 25, the layer thickness remains constant along the y direction of the first layer 9. At the end of the third section 25, the first layer 9 has a grading 31 in which the layer thickness of the first layer 9 decreases and remains constant in a fourth section 26 up to an end face 27.

The first layer 9 is covered by a second layer 10 in a planar manner. The first and the second layer 9, 10 may have the same width in the z direction as the laser diode 2 and cover at least a width of the side face 5 of the laser diode 2. Depending on the chosen embodiment, the first and the second layer 9, 10 may be wider or narrower than the laser diode 2.

The second layer 10 extends along the x direction starting from the first end face 27 up to the opposite second end face 28. The second layer 10 abuts on the radiation surface 15 of the first layer 9 by an irradiation surface 14. The irradiation surface 14 of the second layer 10 is essentially arranged perpendicular to the radiation direction 7 of the electromagnetic radiation 6 of the laser diode 2. This allows for a low-loss coupling of electromagnetic radiation 6 into the second layer 10. The second layer 10 essentially has a constant layer thickness in the y direction in the area of the first, second and third section 23, 24 and 25. In addition, the second layer 10 covers the first layer 9 in the area of the fourth section 26. In this context, the second layer 10 has a radiation surface 13 that is arranged at a distance from the grading 31 in the radiation direction 7.

The radiation surface 13 of the second layer 10 is essentially embodied perpendicular to the x direction and arranged in the first area of the fourth section 26. The radiation surface 13 of the second layer 10 is thus essentially arranged perpendicularly to the radiation direction 7 of the electromagnetic radiation 6 of the laser diode 2. As a result, the electromagnetic radiation 6 may be emitted from the radiation surface 13 of the second layer 10 with low coupling-out losses. In the depicted embodiment, the second layer 10 is covered by a third layer 11. The third layer 11 comprises a radiation surface 29 that is essentially arranged in parallel to the radiation surface 13 of the second layer 10. The radiation surface 29 of the third layer 11, as well, may be produced by means of a molding process. Radiation guiding of the electromagnetic radiation 6 in the second layer 10 is schematically depicted in the form of dashed lines. The first, the second and the third layer 9, 10, 11 extend along the z direction of the component 1 over its entire width that is arranged perpendicular to the x axis.

The second layer 10 has a thickness in the y direction. Depending on the chosen embodiment, the thickness of the second layer 10 may change along the x axis. For example, the thickness of the second layer 10 may increase or decrease in the direction of the radiation surface 13.

Opposite to the end face 27, a second end face 28 of the layer arrangement 8 is provided. The first and the second end face 27, 28 may be produced in the layer arrangement by means of separation processes such as sawing. Depending on the chosen embodiment, the third layer 11 may be omitted. In this embodiment, as well, the first radiation surface 15 of the first layer 9 and the radiation surface 13 of the second layer 10 may be produced by means of molding processes.

Depending on the chosen embodiment, a carrier 3 may be provided having a plurality of laser diodes 2. The laser diodes 2 are provided with a layer arrangement 8, as described. Subsequently, the carrier 3 and the layer arrangement 8 are, e.g., separated by means of sawing to result in individual optoelectronic components, as shown in FIG. 8.

Figure 9:
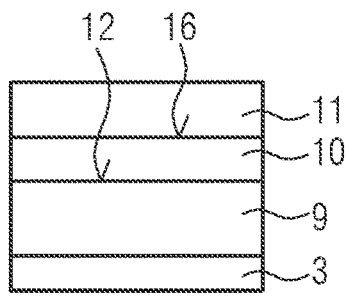
FIG. 9 shows a cross-section through the arrangement of FIG. 8.

FIG. 9 shows a schematic cross-section A-A through the third section 25 of the component 1 of FIG. 8.

Figure 10:
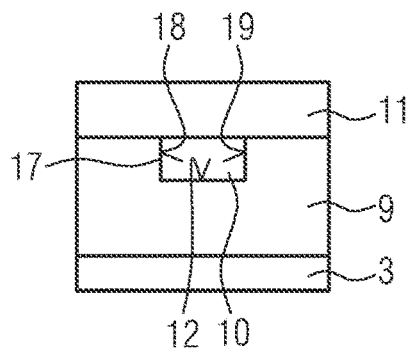
FIG. 10 depicts a cross-section through an embodiment of the arrangement of FIG. 8 with a trench for the second layer.

Depending on the chosen embodiment, the embodiment of FIG. 8 may comprise a first layer 9 in which the trench 17 is formed, wherein the second layer 10 is arranged in the trench 17. FIG. 10 shows a cross-section A-A through the third section 25 of a component 1 in which the second layer 10 is arranged in a trench 17 of the first layer 9.

The first, second and third layer 9, 10, 11 may, e.g., be produced one after the other by means of compression molding. Thereby, corresponding dies are used that particularly provide the quality of the radiation and irradiation surfaces. Depending on the chosen embodiment, the second layer 10 may be deposited on the first layer 9 by means of spraying after the first layer 9 has been produced. In addition, the trench 17 may be formed in the first layer 9 by means of a molding method, in particular by means of compression molding.

Depending on the chosen embodiment, the trench 17 may also be produced in the third layer 11, wherein the second layer 10 is arranged in the trench 17 of the third layer 11.

Figure 11:
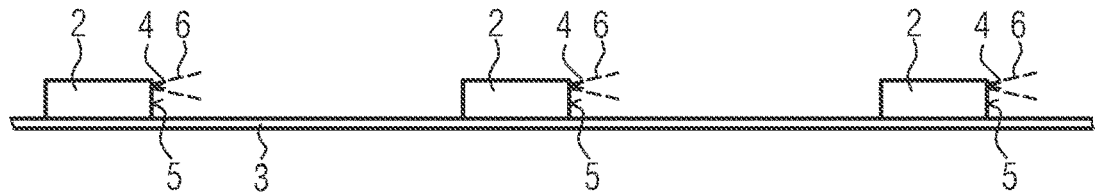
FIGS. 11 to 13 depict method steps for producing the arrangement of FIG. 8.
Figure 12:
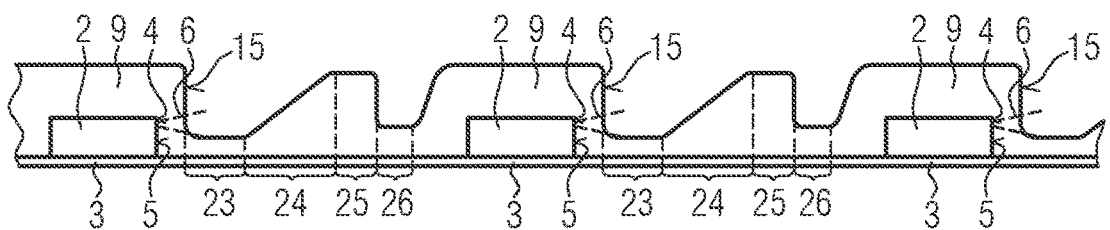
Figure 13:
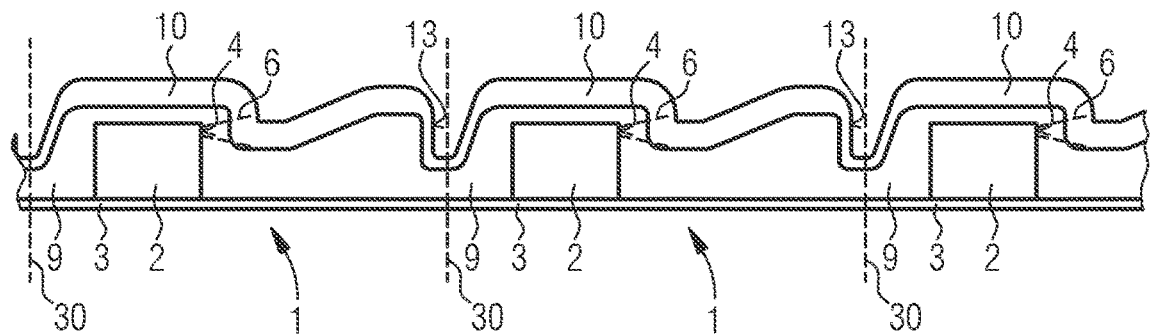

FIGS. 11 to 13 exemplarily show method steps for producing a carrier with a plurality of light-emitting diodes 2 that are eventually singularized to result in individual optoelectronic components. FIG. 11 shows a schematic cross-section through a carrier 3 having a plurality of laser diodes 2 arranged side by side. At a first side face 5, the laser diodes 2 have a radiation surface 4 in the upper end section.

In a first method step, the laser diodes 2 and the carrier 3 are covered by a first layer 9, as shown in FIG. 12. Thereby, the desired surface structure is, e.g., produced by means of molding processes. In particular, in this manner radiation surfaces 15 of the first layer 9 are formed at a predefined distance to the radiation surface 4 in the radiation direction 7. In addition, the first, second, third and fourth section 23, 24, 25, 26 are molded in the first layer 9.

As shown in FIG. 13, the second layer 10 is then, e.g., produced by means of a molding process. Thereby, a radiation surface 13 of the second layer 10 is particularly produced by means of the molding process. Depending on the chosen embodiment, a third layer 11 may be deposited on the second layer 10, as explained in conjunction with FIG. 8.

Subsequently, individual optoelectronic components 1 in the arrangement are singularized by means of saw cuts 30 that are depicted as dashed lines.

This method may be used for all described embodiment examples of the component. In addition, other methods may be used for depositing the first, second and third layer 9, 10, 11, as well.

Figure 14:
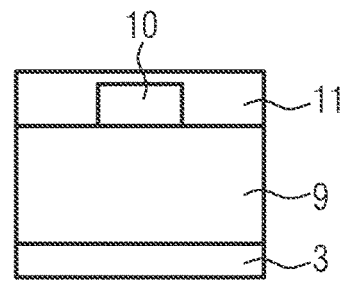
FIG. 14 shows a cross-section through an embodiment of the arrangement of FIG. 8 having a bridge-like second layer.

FIG. 14 shows a cross-section A-A through the third section 25 of a component 1 in which the second layer 10 is arranged on the first layer 9 as a bridge and covered by the third layer 11.

The first, second and third layer 9, 10, 11 may, e.g., be produced one after the other by means of compression molding. For this purpose, corresponding dies are used that particularly provide the quality of the radiation and irradiation surfaces. Depending on the chosen embodiment, the first layer 9 and the third layer 11 may also be deposited by means of spraying. In addition, the bridge-like third layer to may be produced on the first layer 9 by means of a forming method, in particular compression molding.

Depending on the chosen embodiment, the third layer 10 may be embodied, in particular formed, on the first layer 9 as a bridge. Subsequently, the second layer 10 and the free areas of the first layer 9 are covered by the third layer 11 at least adjacent to the bridge-like second layer 10. In this context, the second layer 10 is completely covered by the third layer 10. Depending on the chosen embodiment, the radiation surface 13 of the second layer 10 may remain uncovered. The bridge-like second layer 10 may have the same shapes as the second layer 10 in the trench 17 of the first layer 9 or as in the trench 17 of the third layer 11.

In all embodiments, the third layer 11 may consist of the same material as the first layer 9.

For efficient radiation guiding of the electromagnetic beams, the optical refractive indices of the first, second and, potentially, the third layer are chosen in such a way that as much electromagnetic radiation as possible is guided in the second layer by total reflection at the boundary surfaces of the second layer. Due to the thickness of the second layer in the y direction, a limitation of the electromagnetic radiation is achieved in the y direction. Due to a predetermined width of the second layer, particularly by forming a trench in the first layer, in which the second layer is arranged, a limitation of the electromagnetic radiation is achieved in the z direction. For example, the width of the second layer along the z axis and/or the height of the second layer along the y axis may decrease in the direction of the radiation surface of the second layer.

The laser diode may, e.g., be operated in a pulse mode. The laser diode may generate infra-red light, ultra-violet light and/or visible light.

The present invention was illustrated and described in conjunction with preferred embodiment examples. However, the invention is not limited to the examples disclosed herein. Rather, a person skilled in the art may devise variations without exceeding the protective scope of the invention.

The invention claimed is:

1. An optoelectronic component comprising:
   a carrier;
   a laser diode arranged with a bottom side on the carrier, wherein the laser diode is configured to emit electromagnetic radiation in a lateral radiation direction via a radiation surface of a lateral face; and
   a radiation-guiding layer arrangement located in front of the lateral face of the laser diode in the radiation direction along a y axis,
   wherein the layer arrangement comprises at least a first layer and a second layer,
   wherein the first layer is deposited by a first molding process on the carrier directly adjacent to the radiation surface of the lateral face of the laser diode,
   wherein the second layer is located on the first layer,
   wherein the first layer and the second layer abut each other via a boundary surface,
   wherein the second layer is transparent for the electromagnetic radiation,
   wherein the first layer has a smaller refractive index than the second layer,
   wherein the layer arrangement is arranged configured such that the electromagnetic radiation of the laser diode is coupled into an irradiation surface of the second layer, guided in the second layer to a radiation surface of the second layer, and emitted via the radiation surface of the second layer,
   wherein the second layer is formed of a second forming material, wherein the radiation surface of the second layer is produced as a formed surface by a second molding process, wherein a distance from a boundary surface of an upper side of the carrier increases along the y axis originating from the irradiation surface of the second layer in a direction of the radiation surface of the second layer with increasing distance from the irradiation surface, and wherein the radiation surface of the second layer is located at a larger distance along the y axis with respect to the carrier than the irradiation surface of the second layer.

2. The component according to claim 1, wherein the first layer abuts directly the radiation surface of the lateral face of the laser diode, wherein the first layer comprises a radiation surface abutting the irradiation surface of the second layer, wherein the first layer is formed of a first forming material, wherein the radiation surface of the first layer is produced as a formed surface by the first molding process, and wherein the first layer and the second layer are configured such that the electromagnetic radiation coming from the radiation surface of the laser diode is at first coupled into the first layer and subsequently from the first layer directly into the second layer.

3. The component according to claim 1, wherein the irradiation surface of the second layer abuts directly the radiation surface of the lateral face of the laser diode.

4. A method for producing an optoelectronic component, the method comprising:

arranging a laser diode for emitting electromagnetic radiation with a bottom side on a carrier in a lateral direction of the electromagnetic radiation, the laser diode having a radiation surface of a lateral face; and forming a radiation-guiding layer arrangement in front of the lateral face of the laser diode in a direction of the electromagnetic radiation along a y axis, wherein the layer arrangement comprises at least a first layer and a second layer, wherein the first layer is deposited on the carrier, wherein the second layer is subsequently deposited on the first layer by a second molding method so that the first layer and the second layer abut each other via a boundary surface, wherein the second layer is formed from a material transparent for the electromagnetic radiation, wherein the first layer has a smaller refractive index than the second layer, wherein the layer arrangement is configured such that the electromagnetic radiation of the laser diode is coupled into the second layer and is guided to a radiation surface of the second layer, wherein the radiation surface of the second layer is produced as a formed surface by the second molding method, wherein a distance from a boundary surface of an upper side of the carrier increases along the y axis originating from an irradiation surface of the second layer in a direction of the radiation surface of the second layer with increasing distance from the irradiation surface, and wherein the radiation surface of the second layer is arranged at a larger distance along the y axis with respect to the carrier than the irradiation surface of the second layer.

5. The method according to claim 4, wherein a plurality of laser diodes is arranged on the carrier, wherein the first layer is deposited on the laser diodes and on the carrier prior to the second layer, wherein, for each laser diode, a radiation surface of the second layer is molded, wherein an arrangement for the plurality of laser diodes is subsequently divided up into individual components, and wherein a parting line through the first layer and the second layer is introduced laterally with a predetermined distance to the radiation surface of the second layer.

6. The method according to claim 4, wherein a plurality of laser diodes is arranged on the carrier along a row in predetermined distances, wherein the first layer is deposited on the laser diodes of the row and on the carrier prior to the second layer being deposited between the laser diodes, wherein, for each laser diode of the row, a radiation surface of the second layer is molded and formed using a die, wherein the row of laser diodes is subsequently separated into individual laser diodes, and wherein a parting line through the first layer and the second layer is introduced laterally with a predetermined distance to the radiation surface of the second layer of a laser diode.

7. The method according to claim 4, wherein the first layer is formed directly abutting the radiation surface of the lateral face of the laser diode, wherein the radiation surface of the first layer is produced as a formed surface by a first molding process, wherein the radiation surface of the first layer abuts an irradiation surface of the second layer, and wherein the first layer and the second layer are embodied such that the electromagnetic radiation coming from the radiation surface of the laser diode is at first coupled into the first layer and subsequently from the first layer directly into the second layer.

8. The method according to claim 4, wherein the second layer is formed directly abutting the radiation surface of the lateral face of the laser diode with the irradiation surface.

9. The method according to claim 4, wherein the first layer is formed such that starting from the irradiation surface of the second layer the first layer has a constant layer thickness in a first section, wherein after the first section the layer thickness of the first layer increases continuously in a second section in the direction to a third section, wherein in the third section the layer thickness remains constant, wherein at the end of the third section the first layer is a grading in which the layer thickness of the first layer decreases and remains constant in a fourth section up to an end face, wherein the first layer and the second layer are embodied such that the radiation surface of the second layer has a larger distance along the y axis to the carrier than the radiation surface of the laser diode, and wherein the radiation surface of the second layer is arranged above the fourth section of the first layer.

10. The method according to claim 4, wherein the second layer is arranged on a first section of the first layer, on a second section of the first layer and on a third section of the first layer with an essentially constant layer, wherein the second layer covers the first layer in a fourth section, and wherein the radiation surface of the second layer is arranged at a distance from the grading in a radiation direction.

11. The method according to claim 7, wherein the laser diode is embedded in the first layer, wherein all lateral faces of the laser diode and an upper side of the laser diode are covered by the first layer, wherein the layer arrangement further comprises a third layer, wherein the third layer is arranged on the second layer, wherein the second layer has a larger refractive index than the third layer, wherein the third layer covers the radiation surface of the second layer, wherein the third layer comprises a radiation surface, wherein the electromagnetic radiation is coupled into the third layer via the radiation surface of the second layer and is emitted via the radiation surface of the third layer, wherein the third layer comprises a third forming material, and wherein the radiation surface of the third layer is produced as a surface formed directly by a die of a forming method third molding process.

12. The component according to claim 1, wherein, starting from the irradiation surface of the second layer, the first layer has a constant layer thickness in a first section, wherein, after the first section the layer thickness of the first layer increases continuously in a second section in a direction to a third section, wherein, in the third section, the layer thickness remains constant, wherein at an end of the third section the first layer has a grading in which the layer thickness of the first layer decreases and remains constant in a fourth section up to an end face, wherein the first section, the second section, the third section and the fourth section extend along the y axis, wherein the radiation surface of the second layer is arranged above the fourth section of the first layer, and wherein the radiation surface of the second layer is arranged along the y axis at a distance from the grading.

13. The component according to claim 2, wherein, starting from the irradiation surface of the second layer, the first layer has a constant layer thickness in a first section, wherein, after the first section, the layer thickness of the first layer increases continuously in a second section in a direction to a third section, wherein, in the third section, the layer thickness remains constant, wherein, at an end of the third section, the first layer has a grading in which the layer thickness of the first layer decreases and remains constant in a fourth section up to an end face, wherein the first section, the second section, the third section and the fourth section extend along the y axis, wherein the radiation surface of the second layer is arranged above the fourth section of the first layer, wherein the radiation surface of the second layer is arranged along the y axis at a distance from the grading, and wherein the irradiation surface of the second layer is essentially arranged in parallel to the radiation surface of the lateral face of the laser diode.

14. The component according to claim 2, wherein the irradiation surface of the second layer is essentially arranged in parallel to the radiation surface of the lateral face of the laser diode, and wherein the irradiation surface of the first layer is essentially arranged in parallel to the radiation surface of the second layer.

15. The component according to claim 2, wherein the laser diode is embedded in the first layer, wherein all lateral faces of the laser diode and an upper side of the laser diode are covered by the first layer, and wherein the first layer and the second layer extend over the upper face of the laser diode.

16. The component according to claim 15, wherein the layer arrangement further comprises a third layer, wherein the third layer is arranged on the second layer, and wherein the second layer has a larger refractive index than the third layer.

17. The component according to claim 16, wherein the third layer covers the radiation surface of the second layer, wherein the third layer comprises a radiation surface, wherein the electromagnetic radiation is coupled into the third layer via the radiation surface of the second layer and is emitted via the radiation surface of the third layer, wherein the third layer comprises a third forming material, and wherein the radiation surface of the third layer is produced as a surface formed directly by a die of a third molding process.

18. The component according to claim 17, wherein the first layer or the third layer comprises a trench, wherein the second layer is arranged within the trench, or wherein the second layer forms of a bridge on the first layer, and wherein the bridge-like second layer is covered by the third layer.

19. A method for producing optoelectronic components, the method comprising:
arranging laser diodes in a row along a y axis on a carrier, wherein each laser diode is arranged with a bottom side on the carrier in a lateral direction of electromagnetic radiation, and wherein each laser diode has a radiation surface at a lateral face; and
forming a radiation-guiding layer arrangement with a first layer and a second layer,
wherein the first layer is deposited on the laser diodes and on the carrier, wherein each laser diode is embedded in the first layer, wherein all lateral faces of each laser diode and an upper side of each laser diode are covered by the first layer, wherein the first layer abuts directly the radiation surfaces at the lateral faces of the laser diodes,
wherein the first layer is formed of a first forming material that is transparent for the electromagnetic radiation,
wherein the second layer is deposited on the first layer by a second molding method so that the first layer and the second layer abut each other via a boundary surface, wherein the second layer is formed from a material transparent for the electromagnetic radiation, wherein the first layer has a smaller refractive index than the second layer,
wherein, along the y axis between two adjacent laser diodes, the first layer is formed such that along the y axis the first layer comprises a radiation surface abutting an irradiation surface of the second layer,
wherein the radiation surface of the first layer is produced as a formed surface by a first molding process, and wherein the first layer and the second layer are embodied such that the electromagnetic radiation coming from the radiation surface of the laser diode is at first coupled into the first layer and subsequently from the first layer directly coupled into the second layer,
wherein, along the y axis between two adjacent laser diodes, the first layer is formed such that, starting from the irradiation surface of the second layer, the first layer has a constant layer thickness in a first section, wherein, after the first section, the layer thickness of the first layer increases continuously in a second section in a direction to a third section, wherein, in the third section, the layer thickness remains constant, and wherein at an end of the third section the first layer is a grading in which the layer thickness of the first layer decreases and remains constant in a fourth section; and
subsequently singulating individual optoelectronic components by cutting into the fourth section.

20. The method according to claim 19, wherein the second layer is arranged on the first section of the first layer, on the second section of the first layer and on the third section of the first layer with an essentially constant layer, wherein the second layer covers the first layer in the fourth section, wherein the radiation surface of the second layer is arranged at a distance from the grading in the radiation direction along the y axis.

* * * * *